(12) United States Patent
Fukushima et al.

(10) Patent No.: US 10,580,669 B2
(45) Date of Patent: Mar. 3, 2020

(54) SUBSTRATE PROCESSING APPARATUS AND NOZZLE

(71) Applicant: Tokyo Electron Limited, Tokyo (JP)

(72) Inventors: Tsuyoshi Fukushima, Koshi (JP); Kazuhiro Aiura, Koshi (JP); Norihiro Ito, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 193 days.

(21) Appl. No.: 15/657,356

(22) Filed: Jul. 24, 2017

(65) Prior Publication Data
US 2018/0033656 A1    Feb. 1, 2018

(30) Foreign Application Priority Data

Jul. 26, 2016  (JP) .................................. 2016-145942

(51) Int. Cl.
*H01L 21/67*    (2006.01)
(52) U.S. Cl.
CPC .... *H01L 21/67051* (2013.01); *H01L 21/6715* (2013.01)

(58) Field of Classification Search
CPC .................................................. H01L 21/6715
See application file for complete search history.

(56) References Cited

U.S. PATENT DOCUMENTS

2013/0284700 A1\*  10/2013  Nangoy .................. B05B 1/185
216/58

FOREIGN PATENT DOCUMENTS

JP          2008-118109 A       5/2008

\* cited by examiner

*Primary Examiner* — Jason Y Ko
(74) *Attorney, Agent, or Firm* — Pearne & Gordon LLP

(57) ABSTRACT

After a discharge of a processing liquid is stopped, a position of a liquid surface within a nozzle can be observed. A substrate processing apparatus includes a substrate holding mechanism and the nozzle. The substrate holding mechanism is configured to hold a substrate. The nozzle is configured to supply the processing liquid to the substrate. The nozzle includes a pipe member and an observation window. The pipe member has a horizontal part and a downward part extended downwards from the horizontal part, and is configured to discharge the processing liquid from a tip end of the downward part. The observation window is provided at the horizontal part of the pipe member.

10 Claims, 7 Drawing Sheets

US 10,580,669 B2

SUBSTRATE PROCESSING APPARATUS AND NOZZLE

CROSS-REFERENCE TO RELATED APPLICATION

This application claims the benefit of Japanese Patent Application No. 2016-145942 filed on Jul. 26, 2016, the entire disclosures of which are incorporated herein by reference.

TECHNICAL FIELD

The embodiments described herein pertain generally to a substrate processing apparatus and a nozzle.

BACKGROUND

Conventionally, there is known a substrate processing apparatus configured to process a substrate by supplying a processing liquid onto a substrate such as a semiconductor wafer from a nozzle disposed above the wafer (see, for example, Patent Document 1).

Patent Document 1: Japanese Patent Laid-open Publication No. 2008-118109

In this kind of substrate processing apparatus, after a discharge of the processing liquid is stopped, there may be performed a process (hereinafter, referred to as a "withdrawing process") of withdrawing a liquid surface of the processing liquid remaining within the nozzle in order to suppress the processing liquid from dripping down from the nozzle.

Here, in order to check whether the withdrawing process has been performed properly, a position of the liquid surface within the nozzle may need to be observed after the withdrawing process. If, however, the nozzle is made of a material including an opaque material such as a metal as in the case of the nozzle disclosed in Patent Document 1, for example, the inside of the nozzle cannot be seen from the outside, and it is difficult to check the position of the liquid surface within the nozzle.

SUMMARY

In view of the foregoing, an exemplary embodiment provides a substrate processing apparatus and a nozzle which allows a position of a liquid surface within the nozzle to be observed after a discharge of a processing liquid is stopped.

In an exemplary embodiment, a substrate processing apparatus includes a substrate holding mechanism and a nozzle. The substrate holding mechanism is configured to hold a substrate. The nozzle is configured to supply a processing liquid to the substrate. The nozzle includes a pipe member and an observation window. The pipe member has a horizontal part and a downward part extended downwards from the horizontal part, and is configured to discharge the processing liquid from a tip end of the downward part. The observation window is provided at the horizontal part of the pipe member.

According to the exemplary embodiment, after the discharge of the processing liquid is stopped, the position of the liquid surface within the nozzle can be observed.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
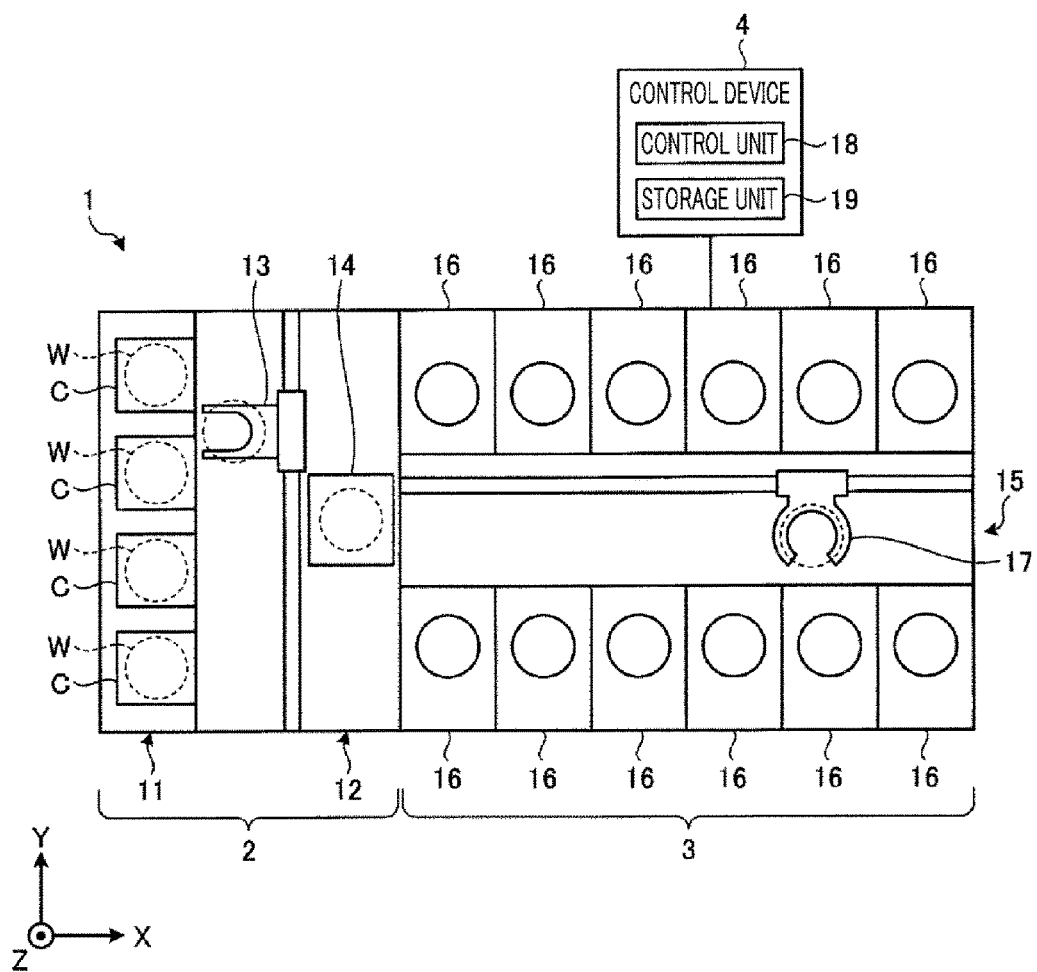
FIG. 1 is a plan view illustrating an outline of a substrate processing system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, an exemplary embodiment of the present disclosure will be explained in detail with reference to the accompanying drawings.

The following description will be provided for an example case where a processing fluid is SPM which is a mixture of sulfuric acid and hydrogen peroxide. However, it should be noted that the processing fluid is no merely limited to the SPM.

FIG. 1 is a plan view illustrating an outline of a substrate processing system provided with a processing unit according to an exemplary embodiment of the present disclosure. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, a plurality of carriers C is placed to accommodate a plurality of substrates (semiconductor wafers in the present exemplary embodiment) (hereinafter, referred to as "wafers W") horizontally.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the substrate processing system 1 is provided with a control device 4. The control device 4 is, for example, a computer, and includes a control unit 18 and a storage unit 19. The storage unit 19 stores a program that controls various processings performed in the substrate processing system 1. The control unit 18 controls the operations of the substrate processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the delivery unit 14. The wafer W placed on the delivery unit 14 is taken out from the delivery unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

Figure 2:
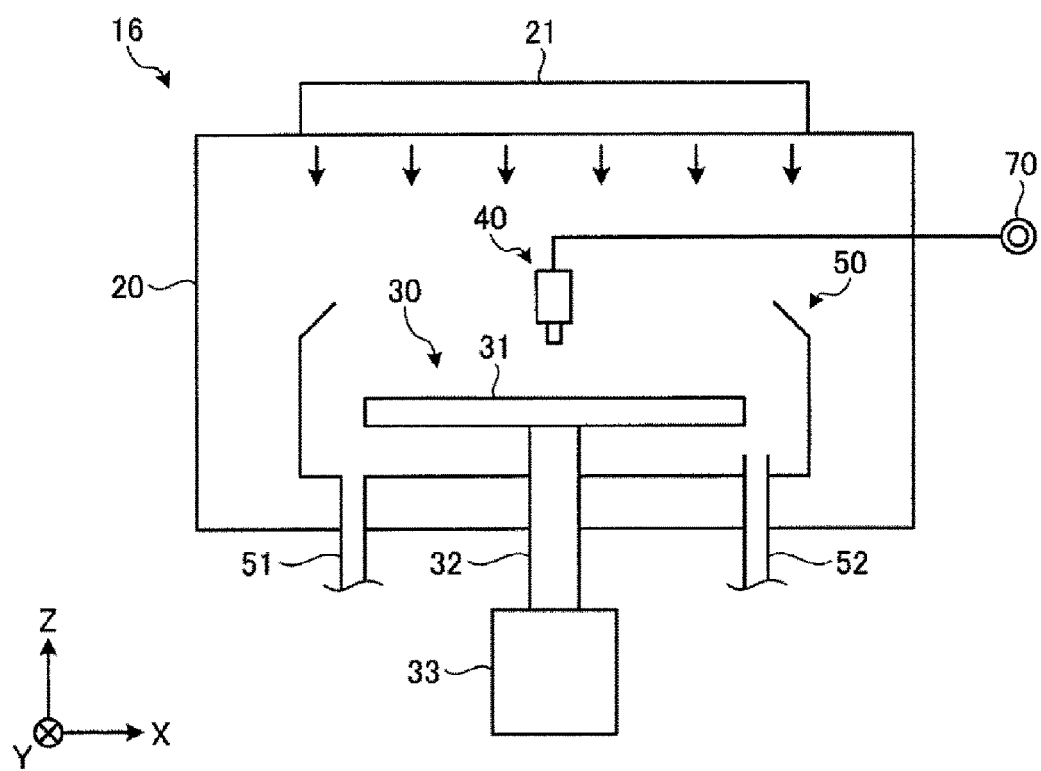
FIG. 2 is a diagram schematically illustrating a configuration of a processing unit.

Now, a schematic configuration of the processing unit 16 will be explained with reference to FIG. 2. FIG. 2 is a schematic plan view illustrating the configuration of the processing unit 16.

As illustrated in FIG. 2, the processing unit 16 is provided with a chamber 20, a substrate holding mechanism 30, a processing fluid supply unit 40, and a recovery cup 50.

The chamber 20 accommodates the substrate holding mechanism 30, the processing fluid supply unit 40, and the recovery cup 50. A fan filter unit (FFU) 21 is provided on the ceiling of the chamber 20. The FFU 21 forms a downflow in the chamber 20.

The substrate holding mechanism 30 is provided with a holding unit 31, a support unit 32, and a driving unit 33. The holding unit 31 holds the wafer W horizontally. The support unit 32 is a vertically extending member, and has a base end portion supported rotatably by the driving unit 33 and a tip end portion supporting the holding unit 31 horizontally. The driving unit 33 rotates the support unit 32 around the vertical axis. The substrate holding mechanism 30 rotates the support unit 32 by using the driving unit 33, so that the holding unit 31 supported by the support unit 32 is rotated, and hence, the wafer W held in the holding unit 31 is rotated.

The processing fluid supply unit 40 supplies a processing fluid onto the wafer W. The processing fluid supply unit 40 is connected to a processing fluid source 70.

The recovery cup 50 is disposed to surround the holding unit 31, and collects the processing liquid scattered from the wafer W by the rotation of the holding unit 31. A drain port 51 is formed on the bottom of the recovery cup 50, and the processing liquid collected by the recovery cup 50 is discharged from the drain port 51 to the outside of the processing unit 16. Further, an exhaust port 52 is formed on the bottom of the recovery cup 50 to discharge a gas supplied from the FFU 21 to the outside.

Figure 3:
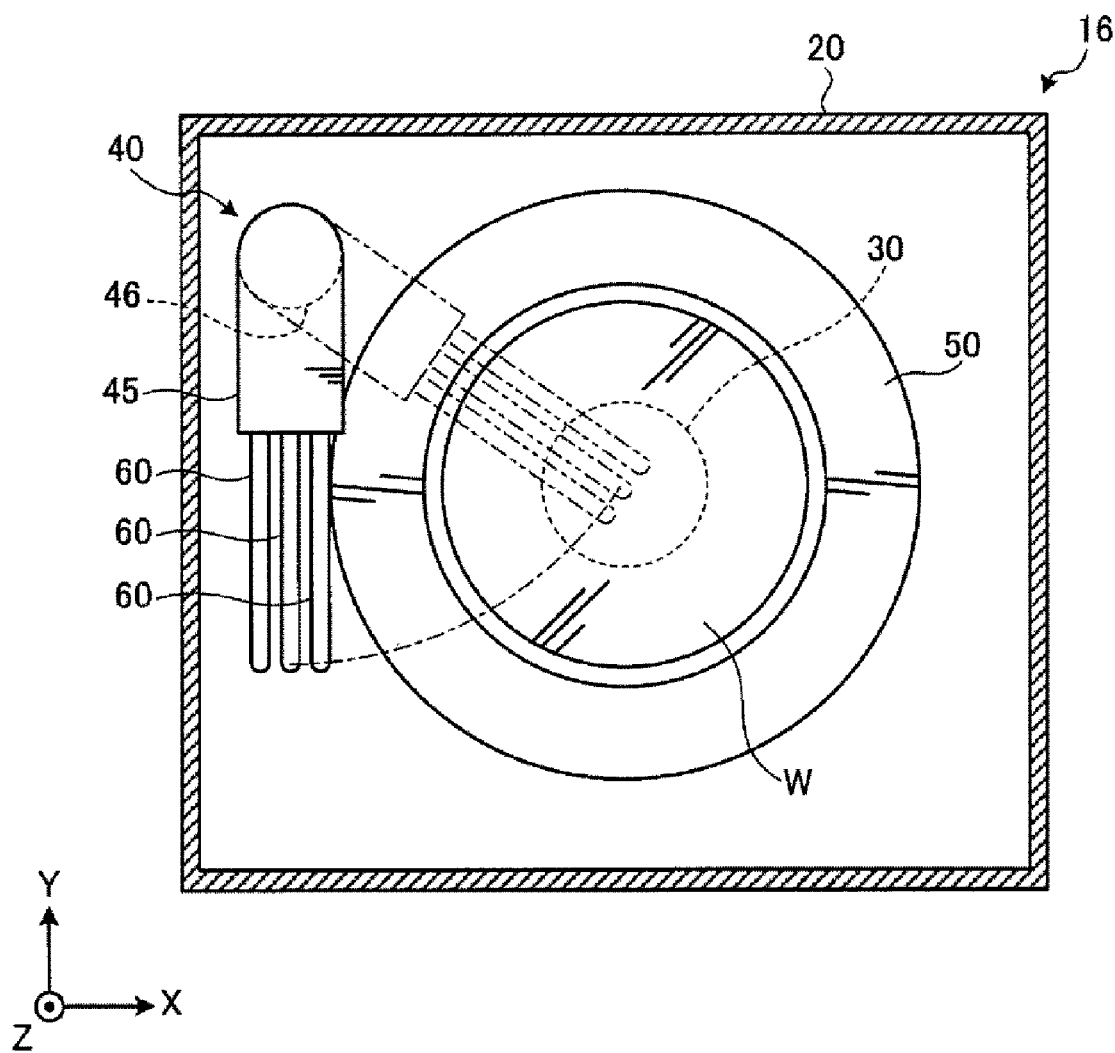
FIG. 3 is a schematic plan view of the processing unit.

FIG. 3 is a schematic plan view of the processing unit 16. As depicted in FIG. 3, the processing unit 16 includes, within the chamber 20, the substrate holding mechanism 30, the processing fluid supply unit 40 and the recovery cup 50.

The processing fluid supply unit 40 is equipped with a plurality of nozzles 60; a nozzle arm 45 configured to support, at a tip end portion thereof, base end portions of the nozzles 60 horizontally; and an arm supporting unit 46 configured to support the nozzle arm 45 such that the nozzle arm 45 is movable up and down and pivotable. The number of the nozzles 60 is not limited to the shown example.

A non-illustrated conductive pipe is inserted through the nozzle arm 45 and the arm supporting unit 46, and the nozzle 60 is connected to the non-illustrated conductive pipe within the nozzle arm 45. The conductive pipe is connected to the processing fluid source 70 which is disposed outside the processing unit 16. The processing liquid is supplied to the nozzle 60 from the processing fluid source 70 through the conductive pipe to be discharged toward the wafer W from the nozzle 60.

After the discharge of the processing liquid is stopped, the processing liquid remains within the nozzle 60 and may drip down from the tip end of the nozzle 60. In the processing unit 16, to suppress the processing liquid from dripping down from the nozzle 60, there is performed a withdrawing process of withdrawing a liquid surface of the processing liquid remaining in the nozzle 60.

To elaborate, an opening/closing valve is provided at the conductive pipe at the downstream of the processing fluid source 70, and a draining pipe is connected to the opening/closing valve. By opening the opening/closing valve after a substrate processing, the processing fluid supply unit 40 drains the processing liquid remaining in the nozzle 60 through the draining pipe by the tare weight of the processing liquid. Accordingly, as the liquid surface of the processing liquid within the nozzle 60 is withdrawn, the processing liquid can be suppressed from dripping down from the tip end of the nozzle 60.

Here, if the processing liquid is not sufficiently withdrawn, the dripping down of the processing liquid may not be completely suppressed. On the other hand, if the processing liquid is withdrawn excessively, a discharge timing of the processing liquid may be delayed at a next substrate processing, or the inside of the nozzle 60 may be dried, so that a particle may be generated. Thus, in order to suppress the aforementioned problems, it is desirable to check a position of the liquid surface of the processing liquid.

In the prior art, however, since a nozzle is made of a material including a metal layer, the inside of the nozzle cannot be seen from the outside. Thus, it has been difficult to check the position of the liquid surface within the nozzle with an observation means, for example, with naked eyes after the withdrawing process.

In this regard, in the processing unit 16 according to the present exemplary embodiment, the nozzle 60 is provided with an observation window through which the position of the liquid surface within the nozzle 60 is allowed to be observed from the outside of the nozzle 60 after the discharge of the processing liquid is stopped. By providing the observation window at the nozzle 60 and thus allowing the position of the liquid surface after the withdrawing process to be observed, for example, with naked eyes, it is possible to easily check whether the withdrawing process has been properly performed.

Figure 4:
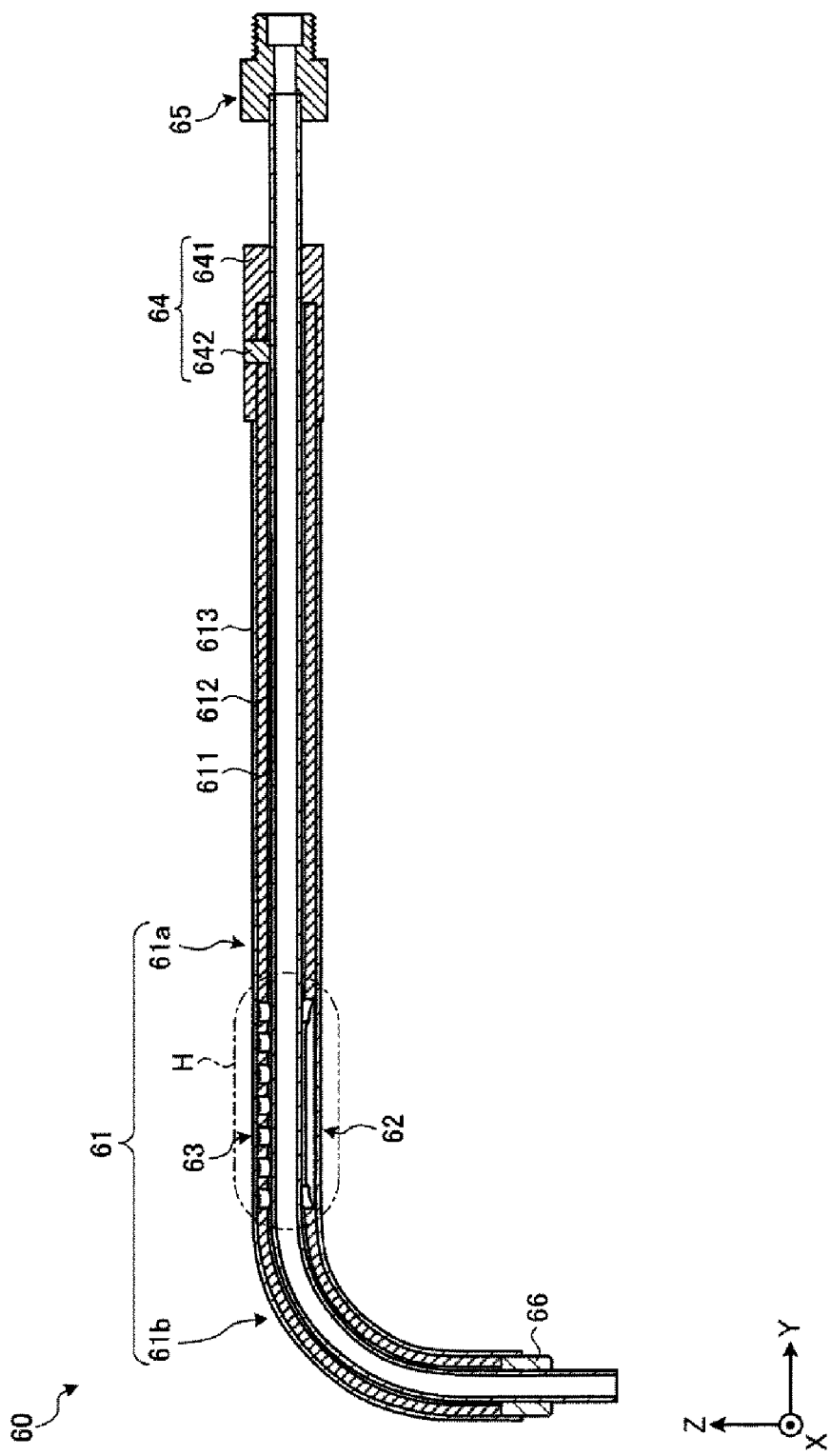
FIG. 4 is a schematic cross sectional view of a nozzle.

Now, a specific configuration of the nozzle 60 will be discussed with reference to FIG. 4. FIG. 4 is a schematic cross sectional view of the nozzle 60.

As shown in FIG. 4, the nozzle 60 includes a pipe member 61, an observation window 62, a lighting window 63, a mounting member 64 and a connecting member 65.

The pipe member 61 includes a horizontal part 61a extended in the horizontal direction and a downward part 61b extended downwards from the horizontal part 61a. The processing liquid is discharged toward the wafer W from a tip end of the downward part 61b. Further, the horizontal part 61a need not be extended in the strictly horizontal direction but may be slightly inclined with an installation tolerance, for example. That is, the term "horizontal direction" used herein includes a substantially horizontal direction.

The pipe member 61 has a three-layer structure including a first layer 611, a second layer 612 and a third layer 613 which are arranged this sequence from the inside.

The first layer 611 is a layer which is in direct contact with the processing liquid and is made of a first member which has chemical resistance and is suppressed from being corroded by the processing liquid. In the present exemplary embodiment, PFA (perfluoroalkoxy alkane) resin is used as the first member. The PFA is a transparent resin member. Further, the first member is not limited to the PFA, and any of various kinds of transparent or semi-transparent members having chemical resistance may be used.

The second layer 612 is made of a second member having higher stiffness than the first member constituting the first layer 611 in order to complement a lack of stiffness of the first layer 611. In the present exemplary embodiment, a PEEK (polyetheretherketone) resin having a higher strength by being mixed with carbon (i.e., C-PEEK) may be used as the second member. The C-PEEK is an opaque resin member. Further, the second member may not be limited to the C-PEEK, but any of various members may be used as long as it has higher stiffness than the first member. By way of example, a typical PEEK resin may be used as the second member, instead of the C-PEEK. Further, the typical PEEK resin is opaque.

The third layer 613 is made of a third member having chemical resistance. In the present exemplary embodiment, the PFA resin is used as the third member, the same as the first member. However, the third member is not limited to the PFA resin but may be implemented by any of various kinds of transparent or semi-transparent members having chemical resistance.

As stated above, in the pipe member 61 according the present exemplary embodiment, all of the first layer 611, the second layer 612 and the third layer 613 constituting the pipe member 61 are made of the resin members. Accordingly, as compared to a case of using, for example, a pipe prepared by coating a metal pipe with the PFA resin, it is possible to suppress metal contamination that might be caused by peeling of the coating. Further, as compared to a nozzle including a metal, the nozzle 60 can be light-weighted.

Furthermore, a gap is provided between the first layer 611 and the second layer 612. Due to the presence of this gap, thermal conduction from the first layer 611 to the second layer 612 can be suppressed.

The observation window 62 is a window member provided to allow an operator to observe the position of the liquid surface of the processing liquid, for example, with naked eyes from the outside after the discharge of the processing liquid is stopped. Further, the lighting window 63 is a window member provided to improve visibility within the pipe member 61.

The observation window 62 and the lighting window 63 are provided at the horizontal part 61a of the pipe member 61. This arrangement of the observation window 62 and the lighting window 63 is designed to correspond to the position of the liquid surface of the processing liquid after the withdrawing process. That is, the position of the liquid surface within the nozzle 60 after the withdrawing process is set to be located within the horizontal part 61a of the pipe member 61 to suppress the processing liquid from dripping down from the nozzle by the tare weight thereof. For this reason, in the processing unit 16 according to the present exemplary embodiment, the observation window 62 and the lighting window 63 are provided at the horizontal part 61a of the pipe member 61. With this configuration, the position of the liquid surface after the withdrawing process, particularly, can be observed, for example, with naked eyes.

Furthermore, it is desirable to provide the observation window 62 and the lighting window 63 in a region of the horizontal part 61a including an end portion thereof at a side of the downward part 61b. It is because, if the processing liquid is excessively withdrawn in the withdrawing process, a discrepancy in the discharge timing would be increased or the inside of the pipe member 61 is dried, so that a particle may be generated. In view of this, the position of the liquid surface after the withdrawing process is set to be located in the region of the horizontal part 61a including the end portion thereof at the side of the downward part 61b, and the observation window 62 and the lighting window 63 are provided to correspond to this region.

Here, the region of the horizontal part 61a including the end portion thereof at the side of the downward part 61b refers to a boundary between the horizontal part 61a and the downward part 61b, that is, a region including a position where the pipe member 61 starts to be extended downwards.

Figure 5:
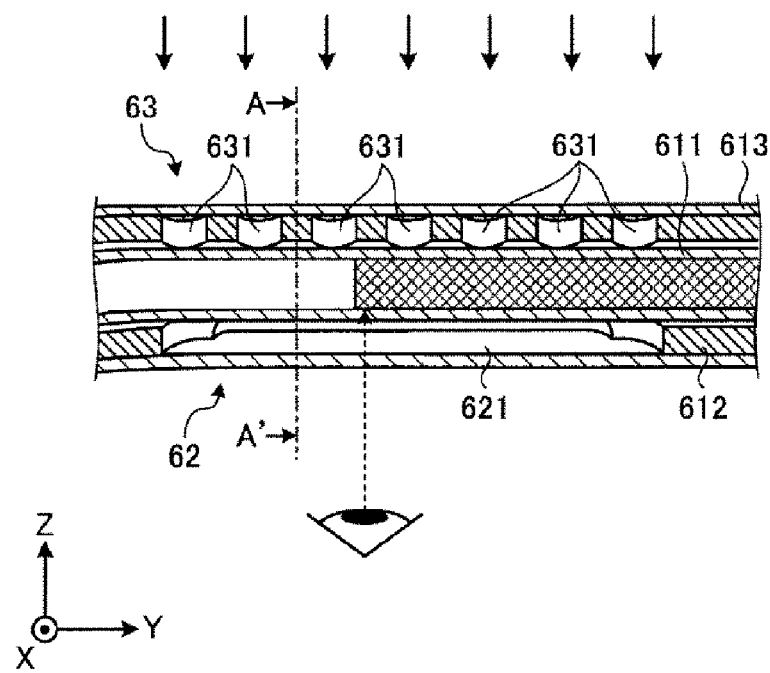
FIG. 5 is a schematic enlarged view of a portion H shown in FIG. 4.
Figure 6:
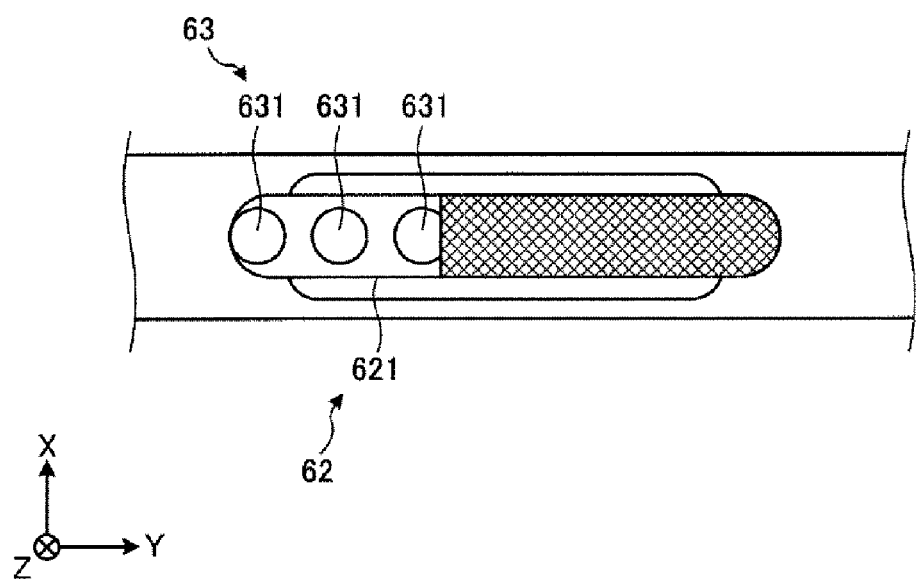
FIG. 6 is a diagram of the portion H when viewed from below.
Figure 7:
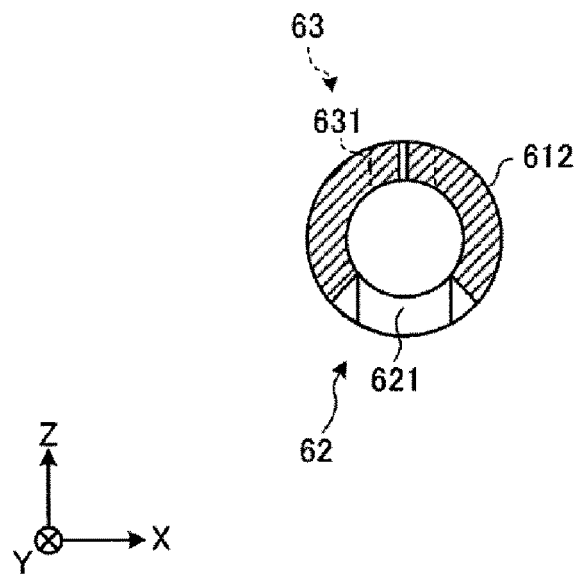
FIG. 7 is a cross sectional view taken along a line A-A' of FIG. 5.

Now, a configuration of the observation window 62 and the lighting window 63 will be explained with reference to FIG. 5 to FIG. 7. FIG. 5 is an enlarged view schematically illustrating a portion H shown in FIG. 4. FIG. 6 is a diagram of the portion H when viewed from below. FIG. 7 is a cross sectional view taken along a line A-A' of FIG. 5. Further, in FIG. 7, illustration of the first layer 611 and the third layer 613 is omitted.

As depicted in FIG. 5, the observation window 62 is an opening 621 formed at the second layer 612 and is configured to allow the inside of the pipe member 61 to be seen via the first layer 611. As stated above, by providing the opening 621 at the second layer 612, the position of the liquid surface after the withdrawing process can be checked, for example, with naked eyes via the first layer 611 made of the transparent member.

As shown in FIG. 5 and FIG. 6, the opening 621 is extended in the lengthwise direction (herein, in the Y-axis direction) of the pipe member 61. Accordingly, it is possible to observe the position of the liquid surface after the withdrawing process in a wide range while suppressing a decrease of the stiffness of the pipe member 61.

Further, as depicted in FIG. 7, the opening 621 has a shape with its opening width gradually increasing from the inside of the second layer 612 to the outside thereof. When observing the position of the liquid surface of the processing liquid after the withdrawing process, the operator or the like can check the position of the liquid surface by looking in through the observation window 62 from below. Since, however, the substrate holding mechanism 30, the recovery cup 50, and so forth are disposed within the processing unit 16, it is difficult to look through the observation window 62 from directly below. In this regard, by forming the opening 621 to have the aforementioned shape, the inside of the pipe member 61 can be seen even when the observation window 62 is seen from obliquely below. Accordingly, for example, the inside of the pipe member 61 can be seen over a non-illustrated window provided at the chamber 20 of the processing unit 16, so that the position of the liquid surface of the processing liquid can be observed without breaking the sealed state of the chamber 20.

Further, the opening 621 is covered with the third layer 613. Therefore, the second layer 612 having conductivity is suppressed from being exposed to the outside. Further, since the third layer 613 is made of the transparent member, like the first layer 611, it is still possible to see the inside of the pipe member 61 even if the opening 621 is covered with the third layer 613.

Here, if an opening area of the opening 621 serving as the observation window 62 is set to be excessively large, the stiffness of the pipe member 61 is deteriorated, so that it becomes difficult to supply the processing liquid stably. Meanwhile, if the opening area of the opening 621 is set to be excessively small, light cannot be received sufficiently, so that the visibility within the pipe member 61 is deteriorated and it becomes difficult to observe the position of the liquid surface after the withdrawing process, for example, with naked eyes.

To solve this problem, in the present exemplary embodiment, the lighting window 63 for receiving light is provided at a position facing the observation window 62 in addition to the observation window 62 for observing the inside of the pipe member 61, for example, with naked eyes.

As stated above, by providing the window for observing the inside of the pipe member 61, for example, with naked eyes and the window for receiving light separately, regions where the stiffness is deteriorated can be dispersed. Therefore, as compared to a case where the visibility is acquired by enlarging the opening area of the opening 621, it is possible to observe the inside of the pipe member 61 while maintaining the stiffness of the pipe member 61.

As depicted in FIG. 5 and FIG. 6, the lighting window 63 is implemented by a multiple number of small holes 631 formed in the second layer 612. These small holes 631 are arranged at a regular distance along the lengthwise direction of the opening 621. By forming the lighting window 63 with these small holes 631, it is possible to obtain a sufficient light amount while suppressing the deterioration of the strength of the pipe member 61. Furthermore, like the opening 621, the small holes 631 are also covered with the third layer 613. Thus, the second layer 612 having conductivity can be suppressed from being exposed to the outside. In addition, the multiple number of small holes 631 are provided in a range where they can be seen from the observation window 62 (see FIG. 6).

The observation window 62 is provided at a lower portion of the pipe member 61, and the lighting window 63 is provided at an upper portion of the pipe member 61. In this way, by arranging the observation window 62 and the lighting window 63 in the vertical direction with respect to the pipe member 61, the inside of the pipe member 61 can be observed without being hampered by the presence of other nozzles 60 even in case that the multiple number of nozzles 60 are arranged in parallel (see FIG. 3). Further, considering a space above the nozzle 60 is larger than a space under the nozzle 60, the observation window 62 is provided at the lower portion of the pipe member 61. However, the exemplary embodiment is not limited thereto, and the observation window 62 may be provided at the upper portion of the pipe member 61 and the lighting window 63 may be provided at the lower portion of the pipe member 61. Furthermore, in case that the processing fluid supply unit 40 is equipped with a single nozzle 60, the observation window 62 and the lighting window 63 may be formed at a side portion of the pipe member 61.

Referring back to FIG. 4, a configuration of a tip end portion of the pipe member 61 will be explained. As illustrated in FIG. 4, the first layer 611 is protruded from the second layer 612 and the third layer 613 at a tip end portion of the downward part 61b. In the nozzle 60 according to the present exemplary embodiment, though the first layer 611 is protruded, there arises no risk of short circuit because the first layer 611 is not electrically conductive. Furthermore, since the first layer 611 is transparent or semi-transparent, the position of the liquid surface within the nozzle at a nozzle tip end can be observed, for example, with naked eyes after the discharge of the processing liquid is stopped.

Moreover, the nozzle 60 is equipped with a sealing member 66 which is provided at an outside of the first layer 611 protruded from the second layer 612 at the tip end portion of the downward part 61b and is configured to seal an end surface of the second layer 612. As stated, since an outer surface of the second layer 612 is covered with the third layer 613 and the end surface of the second layer 612 is sealed by the sealing member 66, the second layer 612 having conductivity can be suppressed from being exposed to the outside.

In addition, the third layer 613 is protruded from the second layer 612 at the tip end portion of the downward part 61b to cover at least a part of the sealing member 66. Accordingly, position deviation of the sealing member 66 can be avoided without performing welding or the like.

Figure 8:
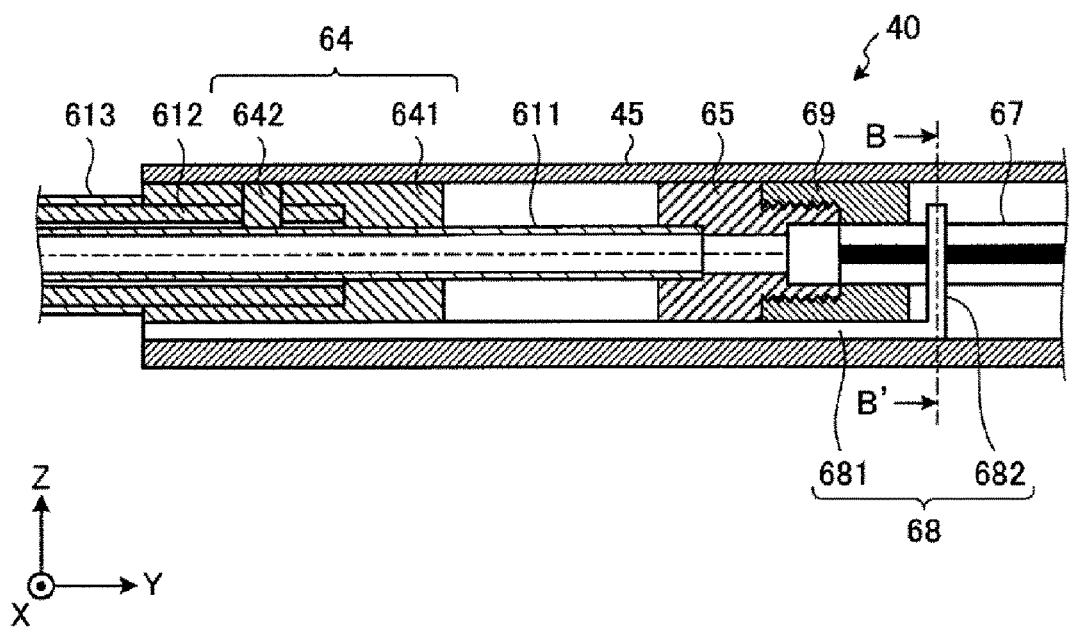
FIG. 8 is a schematic cross sectional view illustrating an internal configuration of a nozzle arm.
Figure 9:
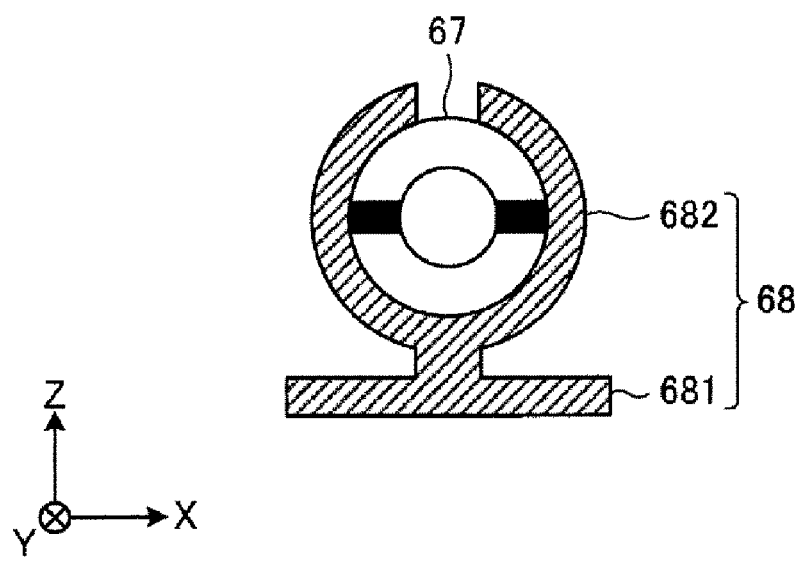
FIG. 9 is a cross sectional view taken along a line B-B' of FIG. 8.

Now, an internal configuration of the nozzle arm 45 will be discussed with reference to FIG. 8 and FIG. 9. FIG. 8 is a schematic cross sectional view illustrating an internal configuration of the nozzle arm 45. FIG. 9 is a cross sectional view taken along a line B-B' of FIG. 8.

As illustrated in FIG. 8, as a base end portion of the nozzle 60 is fitted into a hollow portion of the nozzle arm 45, the mounting member 64 provided at the base end portion is fixed to the hollow portion of the nozzle arm 45 to be supported by the nozzle arm 45. The mounting member 64 includes a main body portion 641 covering a base end portion of the second layer 612; and a pin 642 inserted into the main body portion 641 and the second layer 612 to suppress a rotation or a position deviation of the second layer 612. The main body portion 641 and the pin 642 are made of a fourth member having conductivity. In the present exemplary embodiment, a carbon PTFE (polytetrafluoroethylene) resin may be used as the fourth member. The carbon PTFE is a PTFE mixed with carbon and has higher strength as compared to the typical PTFE.

A base end portion of the third layer 613 is welded to a tip end surface of the main body portion 641. Accordingly, exposure of the second layer 612 having the conductivity can be avoided.

A base end portion of the first layer 611 passes through the main body portion 641 of the mounting member 64, and is connected to one end of the connecting member 65 provided at the rear of the mounting member 64. The other end of the connecting member 65 is connected to a joint member 69 provided at a tip end portion of a conductive pipe 67. To elaborate, a male thread is formed at the other end of the connecting member 65, and a female thread is formed at a tip end side of the joint member 69. By screwing the male thread of the connecting member 65 into the female thread of the joint member 69, the connecting member 65 and the joint member 69 are coupled, and the pipe member 61 and the conductive pipe 67 are connected via the connecting member 65 and the joint member 69.

Further, by unscrewing the connecting member 65 in the reverse direction to the screwing direction, the screw-coupling of the connecting member 65 to the joint member 69 is released, and the nozzle 60 is separated from the nozzle arm 45. Accordingly, the nozzle 60 can be replaced.

The connecting member 65 is made of a fifth member having chemical resistance. In the present exemplary embodiment, a PFA resin is used as the fifth member.

As mentioned above, since the pipe member 61 of the nozzle 60 does not include the conductive pipe 67, when the inside of the pipe member 61 is observed through the observation window 62, the visibility is not hampered due to a black strip-shaped conductive member for achieving the conductivity of the conductive pipe 67. Thus, as compared to a case where the pipe member 61 includes the conductive pipe 67, the visibility of the inside of the pipe member 61 can be improved.

Further, a conducting member 68 configured to electrically connect the nozzle 60 and the conductive pipe 67 is provided within the hollow portion of the nozzle arm 45. As depicted in FIG. 8 and FIG. 9, the conducting member 68 includes an extended portion 681 which has one end in contact with a lower portion of the mounting member 64 and has the other end extended to be located under the conductive pipe 67; and a fitting portion 682 which uprightly stands from the extended portion 681 and is fitted to the conductive pipe 67 from the outside thereof. Accordingly, a conducting path made up of the second layer 612, the mounting member 64, conducting member 68 and the conductive pipe 67 is formed.

As stated above, the substrate processing apparatus according to the present exemplary embodiment includes the substrate holding mechanism and the nozzle. The substrate holding mechanism holds the substrate. The nozzle supplies the processing liquid to the substrate. Further, the nozzle is equipped with the pipe member and the observation window. The pipe member includes the horizontal part and the downward part extended downwards from the horizontal part. The processing liquid is discharged from the tip end of the downward part. The observation window is provided at the horizontal part of the pipe.

As stated, by providing the observation window 62 at the horizontal part 61a of the pipe member 61, the position of the liquid surface within the nozzle 60 can be observed, for example, with naked eyes after the discharge of the processing liquid is stopped, particularly after the withdrawing process. Therefore, it is possible to suppress the processing liquid from dripping down due to the insufficient withdrawing or to suppress the particle generation that might be caused as the inside of the pipe member 61 is dried due to the excessive withdrawing.

Furthermore, the pipe member 61 includes the first layer 611 made of the transparent or semi-transparent member and the second layer 612 made of the opaque member which are arranged in sequence from the inside thereof. The observation window 62 is the opening 621 formed at the second layer 612 and allows the inside of the pipe member 61 to be observed via the first layer 611.

As stated above, by providing the opening 621 at the second layer 612, it is possible to observe the position of the liquid surface after the withdrawing process via the first layer 611 made of the transparent or semi-transparent member.

Moreover, the pipe member 61 is also equipped with the lighting window 63 disposed to face the observation window 62. By providing the window for observing the inside of the pipe member 61 and the window for receiving light separately, the regions where the stiffness is deteriorated can be dispersed. Therefore, as compared to the case where the visibility is obtained by enlarging the opening area of the opening 621, it is possible to observe the inside of the pipe member 61 effectively while maintaining the stiffness of the pipe member 61.

In addition, the lighting window 63 is implemented by the multiple number of small holes 631 formed in the second layer 612. By forming the lighting window 63 with these small holes 631, it is possible to obtain the sufficient light amount while suppressing the deterioration of the stiffness of the pipe member 61 as compared to a case where the lighting window 63 is composed of one opening.

Further, the second layer 612 is made of the resin having the conductivity, and the first layer 611 is protruded from the second layer 612 at the tip end portion of the downward part 61b. Also, the pipe member 61 further includes the third layer 613 made of the transparent or semi-transparent member provided outside the second layer 612. Further, the nozzle 60 is also equipped with the sealing member 66 which is provided at the outside of the first layer 611 protruded from the second layer 612 at the tip end portion of the downward part 61b and is configured to seal the end surface of the second layer 612.

As stated above, by covering the outer surface of the second layer 612 with the third layer 613 and by sealing the end surface of the second layer 612 with the sealing member 66, the second layer 612 having the conductivity can be suppressed from being exposed to the outside.

Furthermore, the third layer 613 is protruded from the second layer 612 at the tip end portion of the downward part 61b and covers at least a part of the sealing member 66.

Accordingly, the position deviation of the sealing member 66 can be easily avoided without recourse to welding or the like.

Moreover, the first layer 611 is protruded from the second layer 612 at the base end portion of the horizontal part 61a, and is connected to the conductive pipe 67 via the connecting member 65. Further, the nozzle 60 includes the nozzle arm 45 configured to support the pipe member 61 pivotably; the conductive mounting member 64 provided on the outside of the second layer 612 at the base end portion of the horizontal part 61a and configured to mount the pipe member 61 to the nozzle arm 45; and the conducting member 68 which is in contact with the mounting member 64 and the conductive pipe 67 and is configured to electrically connect the second layer 612 and the conductive pipe 67 via the mounting member 64. With this configuration, the conducting path can be obtained.

Furthermore, the observation window 62 is provided in the region of the horizontal part 61a including the end portion thereof at the side of the downward part 61b. It is desirable to set the position of the liquid surface after the withdrawing process to be within the region of the horizontal part 61a including the end portion thereof at the side of the downward part 61b in order to suppress the particle generation due to drying of the inside of the pipe member 61 and the like. Further, by providing the observation window 62 to correspond to this position, it is possible to appropriately observe the position of the surface liquid within the nozzle 60 after the withdrawing process.

In the above-exemplary embodiment, the second layer 612 is formed of the resin member. However, the second layer may not necessarily be made of the resin member but may be made of, for example, a metal. As already stated, even if the second layer is made of the metal, the problem of corrosion or the like does not occur since the second layer is configured to be suppressed from being exposed to the outside.

Additionally, in the above-described exemplary embodiment, the downward part 61b is extended downwards from the horizontal part 61a in a curved shape. However, the downward part 61b may be extended downwards from the horizontal part 61a at a right angle, for example.

Further, in the above-described exemplary embodiment, the nozzle 60 is disposed above the wafer W. Accordingly, the downward part 61b is disposed to face vertically downwards, and the observation window 62 and the lighting window 63 are respectively provided at the lower portion and the upper portion of the pipe member 61. However, without being limited to being disposed above the wafer W, the nozzle 60 may be disposed under the wafer W. In such a case, the nozzle 60 may be disposed such that the downward part 61b faces vertically upwards, and the observation window 62 and the lighting window 63 are respectively provided at the upper portion and the lower portion of the pipe member 61 with reference to FIG. 4. With this configuration as well, it is possible to observe the position of the liquid surface within the nozzle 60, the same as described in the above exemplary embodiment. Further, in the above-described exemplary embodiment, the naked eyes are used as the observation means. However, the observation means may not necessarily be the naked eyes but may be a sensor, for example, an image sensor or a laser sensor that can observe the position of the liquid surface within the nozzle.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing apparatus, comprising:
   a substrate holding mechanism configured to hold a substrate; and
   a nozzle configured to supply a processing liquid to the substrate,
   wherein the nozzle comprises:
   a pipe member, having a horizontal part and a downward part extended downwards from the horizontal part, configured to discharge the processing liquid from a tip end of the downward part;
   a lighting window provided to receive light within the pipe member; and
   an observation window distinct from the lighting window and provided at the horizontal part of the pipe member such that the processing liquid within the pipe member is observed through the observation window.

2. The substrate processing apparatus of claim 1,
   wherein the pipe member comprises a first layer made of a transparent or semi-transparent member and a second layer made of an opaque member which are arranged in sequence from an inside thereof, and
   the observation window is an opening formed at the second layer and the inside of the pipe member is allowed to be observed via the first layer.

3. The substrate processing apparatus of claim 1,
   wherein the lighting window includes a plurality of small holes formed at the second layer.

4. The substrate processing apparatus of claim 2,
   wherein the second layer is made of a resin having conductivity.

5. The substrate processing apparatus of claim 2,
   wherein the first layer is protruded from the second layer at a tip end portion of the downward part.

6. The substrate processing apparatus of claim 2,
   wherein the second layer is made of a resin having conductivity,
   the first layer is protruded from the second layer at a tip end portion of the downward part,
   the pipe member further comprises a third layer which is made of a transparent or semi-transparent member and is provided at an outside of the second layer, and
   the nozzle comprises a sealing member which is provided at an outside of the first layer protruded from the second layer at the tip end portion of the downward part and is configured to seal an end surface of the second layer.

7. The substrate processing apparatus of claim 6,
   wherein the third layer is protruded from the second layer at the tip end portion of the downward part and is configured to seal at least a part of the sealing member.

8. A substrate processing apparatus, comprising:
   a substrate holding mechanism configured to hold a substrate; and
   a nozzle configured to supply a processing liquid to the substrate,
   wherein the nozzle comprises:
   a pipe member, having a horizontal part and a downward part extended downwards from the horizontal part, configured to discharge the processing liquid from a tip end of the downward part; and an observation window provided at the horizontal part of the pipe member, wherein the pipe member comprises a first layer made of a transparent or semi-transparent member and a second layer made of an opaque member which are arranged in sequence from an inside thereof, the observation window is an opening formed at the second layer and the inside of the pipe member is allowed to be observed via the first layer, the second layer is made of a resin having conductivity, the first layer is protruded from the second layer at a tip end portion of the downward part, the pipe member further comprises a third layer which is made of a transparent or semi-transparent member and is provided at an outside of the second layer, the nozzle comprises a sealing member which is provided at an outside of the first layer protruded from the second layer at the tip end portion of the downward part and is configured to seal an end surface of the second layer, the first layer is protruded from the second layer at a base end portion of the horizontal part and is connected to a conductive pipe, and the nozzle further comprises:

a nozzle arm configured to support the pipe member;

a mounting member, having conductivity, provided at an outside of the second layer at the base end portion of the horizontal part and configured to connect the pipe member to the nozzle arm; and a conducting member which is in contact with the mounting member and the conductive pipe and is configured to electrically connect the second layer and the conductive pipe via the mounting member.

9. The substrate processing apparatus of claim 1, wherein the observation window is provided in a region of the horizontal part including an end portion thereof at a side of the downward part.

10. A nozzle configured to supply a processing liquid to a substrate, comprising:

a pipe member, having a horizontal part and a downward part extended downwards from the horizontal part, configured to discharge the processing liquid from a tip end of the downward part;

a lighting window provided to receive light within the pipe member; and an observation window distinct from the lighting window and provided at the horizontal part of the pipe member such that the processing liquid within the pipe member is observed through the observation window.

* * * * *